United States Patent [19]
Aubry et al.

[11] Patent Number: 4,859,898
[45] Date of Patent: Aug. 22, 1989

[54] SUSPENSION SPRINGS FOR A VIBRATING PIEZOELECTRIC PLATE

[75] Inventors: Jean-Pierre Aubry; Marc Fragneau, both of Asnieres; Jean-Charles Craveur, Chatillon; Denis Janiaud, Les Ulis; Serge Muller, Meudon La Foret, all of France

[73] Assignees: Compagnie D'Electronique Et De Piezo-Electricitie C.E.P.E, Argenteuil; Office Nationale D'Etudes Recherches Aerospatiales Onera, Chatillon, both of France

[21] Appl. No.: 163,946

[22] Filed: Mar. 3, 1988

[30] Foreign Application Priority Data
Mar. 6, 1987 [FR] France ................................ 87 03074

[51] Int. Cl.⁴ .......................................... H01L 41/08
[52] U.S. Cl. ..................................... 310/353; 310/348
[58] Field of Search ...................... 310/348, 351–353

[56] References Cited
U.S. PATENT DOCUMENTS

| | | | |
|---|---|---|---|
| 2,471,625 | 5/1949 | Johnstone | 310/353 X |
| 2,814,741 | 11/1957 | Minnich et al. | 310/353 |
| 3,909,639 | 9/1975 | Kawai et al. | 310/353 |
| 4,136,297 | 1/1979 | Briese | 310/353 |
| 4,267,479 | 5/1981 | Kato | 310/351 X |
| 4,292,562 | 9/1981 | Feder et al. | 310/340 |
| 4,410,827 | 10/1983 | Kogure et al. | 310/370 |
| 4,415,826 | 11/1983 | Kreutzeu et al. | 310/353 X |
| 4,486,681 | 12/1984 | Ishigami et al. | 310/353 |

FOREIGN PATENT DOCUMENTS
0096413 6/1983 Japan .................................. 310/353

Primary Examiner—Mark O. Budd
Attorney, Agent, or Firm—Oblon, Spivak, McClelland, Maier & Neustadt

[57] ABSTRACT

Disclosed is a suspension spring for a vibrating piezoelectric plate including a first part fixed on a base and a second part for supporting the vibrating plate, the second part a tongue having a first and second end, the second end of the tongue supporting the vibrating plate, the spring being designed so that the end of the tongue which is the closest to the fixing point of the first part to the base is that which supports the vibrating plate.

10 Claims, 3 Drawing Sheets

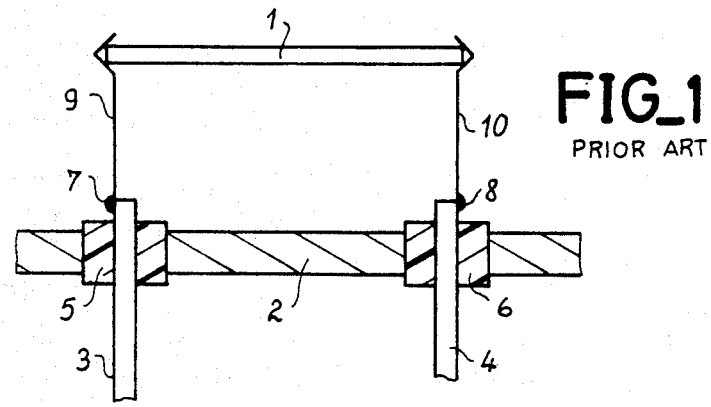
FIG_1 PRIOR ART
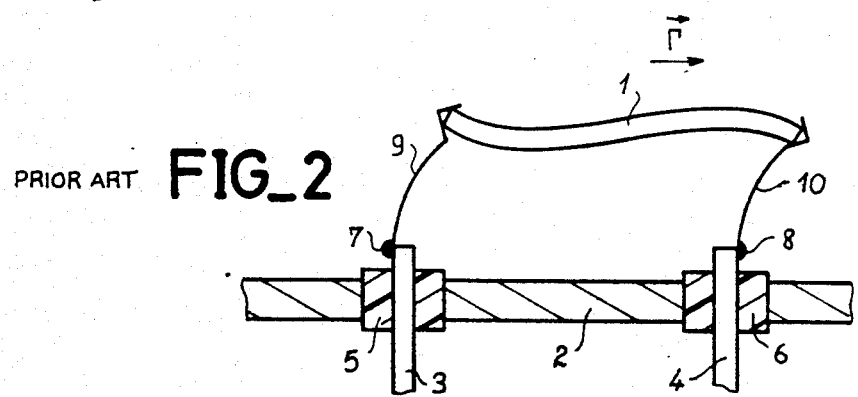
PRIOR ART FIG_2
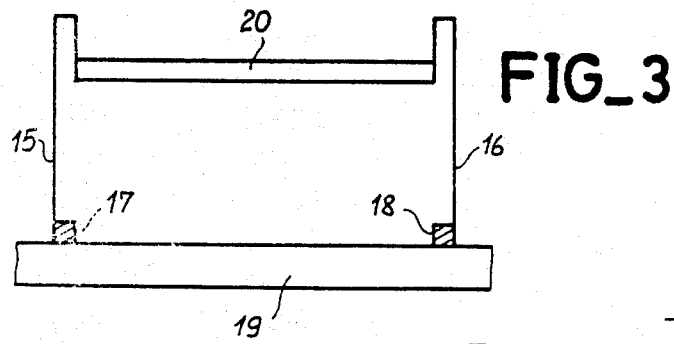
FIG_3
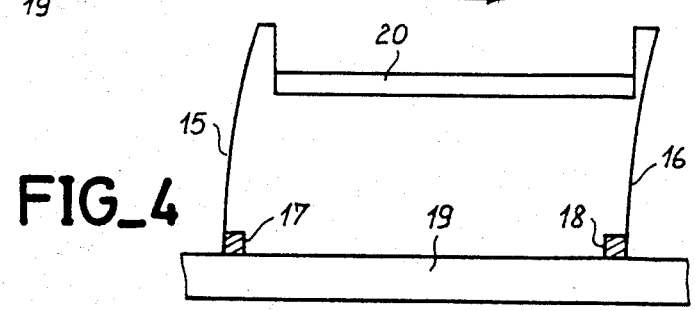
FIG_4

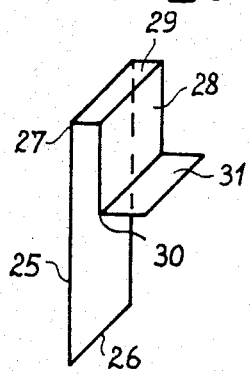
FIG_5
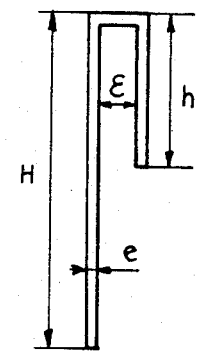
FIG_6
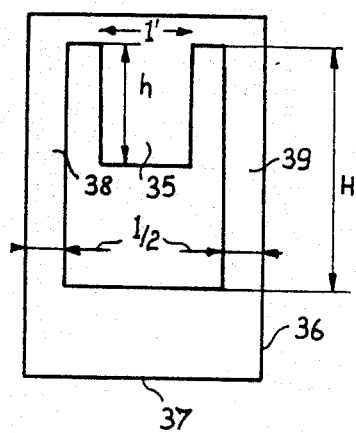
FIG_7
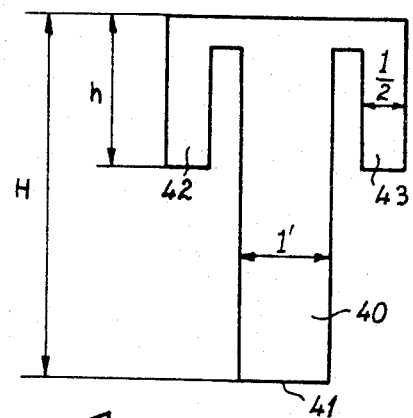
FIG_8
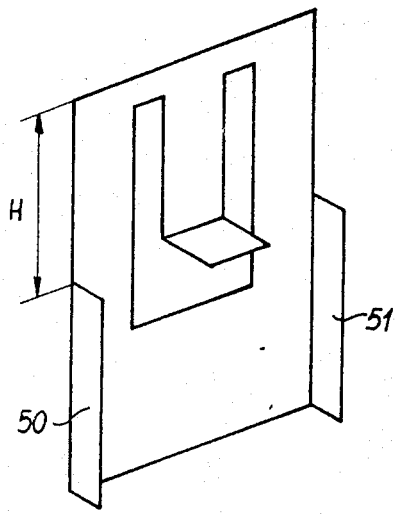
FIG_9

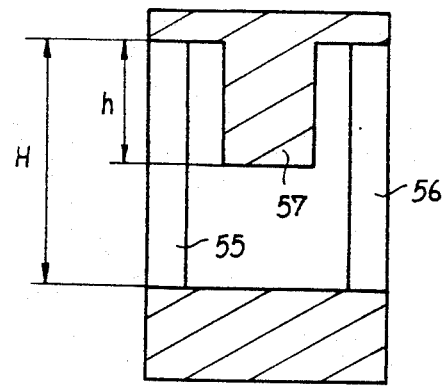
FIG_10
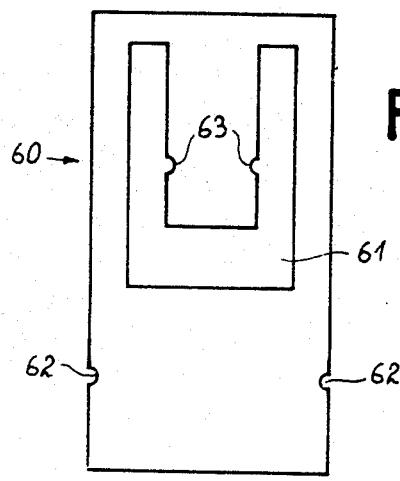
FIG_11
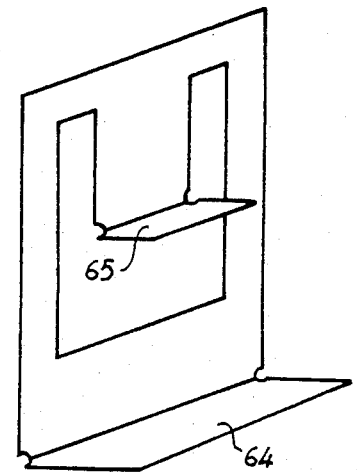
FIG_12

SUSPENSION SPRINGS FOR A VIBRATING PIEZOELECTRIC PLATE

BACKGROUND OF THE INVENTION

1. Field of the Invention

The present invention relates to suspension springs for vibrating piezoelectric plates, used for manufacturing resonators with low accelerometric sensitivity.

2. Description of the Prior Art

Piezoelectric plates used for manufacturing resonators are generally fixed to a base by means of metal springs often formed from a shaped nickel strip. These springs serve as mechanical filters and are consequently indispensible.

Under the effect of an acceleration, these springs are deformed which causes deformation of the piezoelectric plate which they hold. This deformation of the vibrating plate causes a variation in the resonance frequency of the resonator which is sufficiently high to exceed the admissible tolerances in certain devices. A known means of overcoming this drawback consists in providing for this frequency variation. The piezoelectric plate is then designed to resonate, in the absence of acceleration, at a frequency close to but different from the desired frequency and to resonate at the desired frequency for a given acceleration. Besides the difficulty which this frequency approach entails, this remedy is only valid for a given acceleration value and the resonance frequency will very rapidly be situated outside the tolerance limits for acceleration values which are too far removed from this particular value.

In order to overcome these drawbacks, the invention provides suspension springs of an original design, including at least two parts: one part intended to be fixed on the base of the resonator and a part intended to support the vibrating plate. The geometry of these parts as well as their special arrangement mean that the springs of the invention are deformed under the effect of an acceleration but only cause small deformation of the vibrating plate and consequently only a small variation in the resonance frequency, whereby the set tolerances can be complied with.

SUMMARY OF THE INVENTION

The object of the invention provide then a suspension spring for a vibrating piezoelectric plate including a first part intended to be fixed on a base and a second part for supporting the vibrating plate, wherein said second part is a tongue, one of the ends of which is fixed to the first part in a zone of this first part opposite its fixing point to the base, the other end of the tongue supporting the vibrating plate, the end of the tongue which is the closest to the fixing point of the first part to the base being that which supports the vibrating plate.

BRIEF DESCRIPTION OF THE DRAWINGS

Various other objects, features and attendant advantages of the present invention will be more fully appreciated as the same becomes better understood from the following detailed description when considered in connection with the accompanying drawings in which like references characters designate like or corresponding parts throughout the several views and wherein:

FIG. 1 shows a vibrating plate held by springs in accordance with the prior art, FIG. 2 shows the device of FIG. 1 subjected to an acceleration, FIG. 3 shows a vibrating plate held in position by springs in accordance with the invention, FIG. 4 shows the device of FIG. 3 subjected to an acceleration, FIGS. 5 to 10 show springs in accordance with the invention, FIGS. 11 and 12 illustrate the construction of a spring of the invention.

DESCRIPTION OF THE PREFERRED EMBODIMENTS

FIG. 1 illustrates how, in the state of the art, a piezoelectric plate 1 is held in position above a base 2 through which pass two conducting posts 3 and 4 serving as output terminals for the resonator. Glass beads 5 and 6 isolate the posts from the base. To these posts are fixed conducting springs 9 and 10 by spot welds 7 and 8. The springs are formed so that their ends opposite the posts have the shape of a V facing each other for holding the vibrating plate 1 in position. Each face of plate 1 is provided with an electrode which may be connected electrically to one of the springs by a conducting adhesive spot not shown. Electric continuity is thus provided between the posts and the electrodes of the vibrating plate. A protecting case will then be placed and fixed on the base. In the absence of acceleration, the resonator thus formed has a resonance frequency $f_o$.

If the resonator described above is subjected to an acceleration $\vec{\Gamma}$ parallel to the plane of the plate and in the plane of movement of the springs, the vibrating plate will be deformed in the manner shown exaggeratedly in FIG. 2. This deformation, in the form of an S, is due to the deformation of the suspension springs 9 and 10. Under these conditions the resonance frequency of the resonator will be different from $f_o$ and, if the acceleration is sufficiently high, this frequency will be situated outside the tolerated range of variation.

The springs of the invention are deformed when they are subjected to an acceleration, but this deformation causes a deformation of the vibrating plate appreciably less than the deformation of the device of the prior art. This is what is shown in FIGS. 3 and 4. Springs 15 and 16, fixed, for example by spot welds 17 and 18, to base 19 support the vibrating plate 20. Plate 20 may be fixed to the springs by conducting adhesive spots. FIG. 3 shows the resonator in the absence of acceleration. FIG. 4 shows the same resonator subjected to the acceleration $\vec{\Gamma}$. In this case, it is the springs which undergo the acceleration whereas the vibrating plate is practically not deformed.

The spring of the invention comprises at least two parts firmly secured together or possibly connected together by a third part.

The first part is that which will be fixed to the base, directly or by means of a post passing through this base. The second part is a tongue or support member one end of which is intended to support the vibrating plate. This carrying end is the end of the tongue which is the closest to the fixing point of the first part to the base. FIG. 5 shows a suspension spring of the invention. It is formed from a strip bent several times. It includes a first part or portion 25 one end 26 of which is to be fixed to the base of the resonator and the opposite end 27 of which is integrally connected to tongue 28 through an intermediate part 29. Tongue 28 is situated in a plane parallel to the plane of part 25. End 30 of the tongue is intended to support the vibrating plate. This is the end of the tongue which is closest to the fixing point of the spring to the base of the resonator. It may advantageously be extended by a part 31 for conveniently receiving a vibrating plate between two springs of the same type. Once the vibrating plate has been placed on these receiving parts 31, it is sufficient to deposit spots of adhesive for fixing the plate to the springs, the adhesive adhering to part 30 and/or 31.

In order to obtain the best efficiency of the springs of the invention, it is desirable to comply with certain geometrical conditions.

FIG. 6 shows the form previously chosen. Let us assume that the spring has been produced from a metal strip of constant thickness e, and that this strip has been bent so as to obtain parts of length h and H separated by a distance $\epsilon$ as shown in FIG. 6. The distance H is measured from the fixing point of the spring to the corresponding post or to the base. The best results are those for which: $\epsilon \leq 3$ e and h/H≈0.5.

Other forms than the one shown in FIG. 5 may be used for the springs of the invention, and in particular forms where the distance $\epsilon$ is zero.

FIG. 7 shows a spring of this type made from a rectangular piece. Tongue 35 is situated in the same plane as part 36 which will be fixed at its lower end 37 to the base of the resonator. As for FIG. 5, tongue 35 may be advantageously extended by a part receiving the vibrating plate. Tongue 35 has a length l' for a height h. The dimension H in this case is the one corresponding to the height of the U shaped aperture formed symmetrically in the piece. The one situated under the aperture is considered as having infinite rigidity because of the fixing to the base. It is considered that the spring effect is obtained through tongue 35 and the two side legs 38 and 39 of width $\frac{1}{2}$ for a combined width of l. If l=l' and for a piece of constant thickness, the best results will be obtained for h/H=$\sqrt{2}-1$, namely about 0.5. If l is different from l' and for a piece of constant thickness, the best results will be obtained when the ratio h/H is the solution of the following equation:

$$\frac{1}{l'} \times \left(\frac{h}{H}\right)^2 + 2\left(\frac{h}{H}\right) - 1 = 0$$

FIG. 8 shows another variant of the spring of the invention. It has a T shape and is formed of a first part 40 which will be fixed to the base of the resonator by its ends 41 and a second part formed of two flanking half tongues 42 and 43 situated on each side of the first part. Each spring provides then two bearing points for the vibrating plate. As before, the half tongues may be extended by a part for receiving the vibrating plate. the dimensions l, l', h and H are mentioned in FIG. 7. For a piece of constant thickness, the best results will be obtained for the same conditions as for the spring of FIG. 7.

FIG. 9 is another variant of the spring of the invention. It is similar to the type shown in FIG. 7 with in addition lateral sides 50 and 51 bent at 90°. In this case, the dimension H will be that shown in the FIG., the lateral sides suppressing the spring effect of the zones which abut thereon. These lateral sides may also be formed on the other springs with the same consequences.

FIG. 10 shows another embodiment of the invention. This spring ressembles that shown in FIG. 7. Its originality consists in the differences of thickness between the side legs 55 and 56 on the one hand and the rest of the spring on the other. The hatched regions have a thickness e' greater than the thickness of the side legs 55 and 56. If e' is sufficiently large with respect to e (in fact for e' $\geq$ 2e) the hatched regions may be considered as rigid with respect to the non hatched regions. The geometrical condition to respect in order to obtain the best results then becomes very simple: it is necessary for h=H/2. This relationship is independent of the width of the tongue 57 and of that of the sidelegs. The advantage of this solution is that bonding of the plate requires less care since it is formed on a part considered as rigid. With the preceding structures, the adhesive spots must not be too large so as to maintain good flexibility for the tongue, which is a delicate operation because of the small size of the springs.

Different methods may be used for obtaining regions of different thicknesses. Starting with a thin sheet, local deposits may be made by electrodeposition. A thick sheet may also be used which will be machined for example by electroerosion or by chemical machining techniques.

By way of example, the dimensions of the spring shown in FIG. 10 may be as follows:
- dimensions of the starting piece: 2.2 mm×4 mm
- tongue : h=1.32 mm, width 0.8 mm
- H=2.1 mm,
- width of the side legs 0.4 mm
- thicknesses: e'=0.16 mm, e =0.08 mm.

The springs of the invention may be welded directly or not to the bases. To facilitate the vertical positioning of the springs, they may be provided with a bent part serving as base. FIG. 11 shows, before bending, a metal piece 60 for forming a spring in accordance with the invention. This piece has been obtained, for example, by an electroerosion operation during which an aperture 61 and notches 62 and 63 were also formed. As shown in FIG. 12, these notches facilitate bending of the foot 64 of the spring which will be welded and bending of the part 65 which will support the vibrating plate.

The springs of the invention, like those of the prior art, may serve as electric conductors as far as the electrodes of the vibrating plate. The material used may be nickel of quality S.

The relative frequency variation as a function of the acceleration is given by the relationship:

$$\frac{\Delta f}{f} = \vec{K} \cdot \vec{\Gamma},$$

$\vec{K}$ being the accelerometric sensitivity vector of the resonator. Measurement of the frequency variation in response to a given acceleration then makes it possible to determine the value of $\vec{K}$. Measurements have been made for comparing the springs of the invention with those of the prior art. The vibrating plate used has the following characteristics: resonance frequency: 10 MHz, Sc cut section, and operation in partial, self suspended quartz. With prior art springs such as the one shown in FIG. 1, K is equal to about $7 \times 10^{-10}$/g. With springs such as that shown in FIG. 10, K is equal to about $2 \times 10^{-10}$/g. The reduction of this parameter results directly in a proportional reduction of the frequency drift. Obviously numerous modifications and variations of the present invention are possible in light of the above teachings. It is therefore to be understood that within the scope of the appended claims, the invention may be practiced otherwise than as specifically described herein.

What is claimed is:

1. A suspension spring for a piezoelectric vibrating plate, which comprises:
   a first portion having a first end fixed on a base and having a second end;
   a second portion for supporting the vibrating plate wherein said second portion comprises a support member having a first end and a second end, the second end of the support member supporting the vibrating plate, said spring being formed of a strip bent a plurality of times, the first end of said support member being connected to said first portion by an intermediate portion, the support member and the first portion being positioned in planes substantially parallel to each other, wherein the distance separating the support member from said first portion is less than or equal to three times a thickness dimension of said strip, and a length dimension of said support member represents approximately half a length diameter of said first portion.

2. The suspension spring as claimed in claim 1, wherein said support member includes a bent portion for positioning said vibrating plate thereon.

3. A suspension spring for a piezoelectric vibrating plate, which comprises a first portion fixed on a base and a second portion for supporting the vibrating plate, said second portion including a support member having a first end and a second end, the second end supporting the vibrating plate, the first portion having an aperture formed symmetrically therein, said first portion having first and second lateral legs connected to said second portion, wherein the support member has a height h and a width l', H being the height of the aperture and l being the combined width of said first and second lateral legs, such that the following equation:

$$\frac{1}{l'} \times \left(\frac{h}{H}\right)^2 + \left(\frac{h}{H}\right) - 1 = 0$$

is satisfied.

4. The suspension spring as claimed in claim 3, wherein said support member includes a bent portion for positioning said vibrating plate thereon.

5. A suspension spring for a piezoelectric vibrating plate, which comprises a first portion fixed on a base and a second portion for supporting the vibrating plate, said second portion including a support member having a first end and a second end, said second end supporting the vibrating plate and the first portion having an aperture formed symmetrically therein, said first portion having first and second lateral legs wherein said first and second lateral legs have a thickness dimension e less than a thickness dimension e' of a remaining portion of the spring.

6. The suspension spring as claimed in claim 5, wherein $e' \geq 2e$.

7. A suspension spring for a piezoelectric vibrating plate, which comprises a first portion fixed on a base and a second portion for supporting the vibrating plate, said first portion having a vertical bar member, said second portion including a flanking member situated on each side of and connected to said vertical bar of said first portion, each member having a first and second end, the second end of the second portion supporting the vibrating plate.

8. The suspension spring as claimed in claim 7, for which l being the width of said first portion, H the height of the T, h the length of each flanking member and l' the combined width of the flanking members, such that the following equation:

$$\frac{1}{l'} \times \left(\frac{h}{H}\right)^2 + \left(\frac{h}{H}\right) - 1 = 0$$

is satisfied.

9. A suspension spring for a piezoelectric vibrating plate, which comprises a first portion fixed on a base and a second portion for supporting the vibrating plate, said second portion including a support member having a first end and a second end, the second end supporting the vibrating plate; the first portion having an aperture formed symmetrically therein, and the first portion having first and second lateral legs connected to said second portion, said first portion including laterally extending sides.

10. A suspension spring for a piezoelectric vibrating plate, which comprises a first portion fixed on a base and a second portion for supporting the vibrating plate, the second portion including a support member having a first end and a second end, the second end supporting the vibrating plate, the first portion having an aperture formed symmetrically therein, and the first portion having first and second lateral legs connected to the second portion, wherein the first portion including a bent foot portion for fixing the spring to said base.

* * * * *